United States Patent [19]
Ma et al.

[11] Patent Number: 5,371,394
[45] Date of Patent: Dec. 6, 1994

[54] DOUBLE IMPLANTED LATERALLY DIFFUSED MOS DEVICE AND METHOD THEREOF

[75] Inventors: Gordon C. Ma, Phoenix; Hassan Pirastehfar, Mesa; Steven J. Adler, Tempe, all of Ariz.

[73] Assignee: Motorola, Inc., Schaumburg, Ill.

[21] Appl. No.: 153,503

[22] Filed: Nov. 15, 1993

[51] Int. Cl.$^5$ ...................... H01L 29/68; H01L 21/04
[52] U.S. Cl. .................... 257/335; 257/336; 257/344; 257/408; 257/404; 437/15; 437/29; 437/44; 437/45
[58] Field of Search ............... 257/336, 344, 408, 335, 257/404; 437/15, 29, 44, 45

[56] References Cited

U.S. PATENT DOCUMENTS 4,994,904  2/1991  Nakagawa et al. ................. 257/336

Primary Examiner—Edward Wojciechowicz
Attorney, Agent, or Firm—Robert D. Atkins

[57] ABSTRACT

An NMOS transistor has a source and a drain composed of n+ type of semiconductor material. A substrate region composed of a p type of semiconductor material is disposed between the source and the drain. A gate region is disposed above the substrate region and between the source region and the drain region. A first implant region is disposed adjacent to the source region and the gate region. The first implant region is composed of p type of semiconductor material with a first doping concentration. A second implant region is disposed between the first implant region and the substrate. The second implant region is composed of p type of semiconductor material with a second doping concentration. The channel doping profile first and second implant regions is tailored to obtain the optimum internal electric field to maximize device transconductance, while simultaneously controlling the device threshold voltage and punch through characteristics.

11 Claims, 1 Drawing Sheet

DOUBLE IMPLANTED LATERALLY DIFFUSED MOS DEVICE AND METHOD THEREOF

BACKGROUND OF THE INVENTION

The present invention relates in general to MOS devices and, more particularly, to a high gain MOS device with improved frequency response.

MOS devices are commonly used in radio frequency applications such as cellular phones and other communications products. For radio frequency applications it is desirable to obtain higher power gain and improved frequency response than can be obtained in prior art MOS devices.

In MOS devices higher power gain is typically obtained by increasing the transconductance (Gm) of the MOS device. Techniques to improve transconductance generally require advancements in processing technologies, e.g. advances in photolithographic techniques, or advances in thin insulator growth techniques. The increase in Gm is usually accomplished by using a single channel doping implant. The increase in Gm is related to the increase in the internal electric field near the source of the implanted channel. However, in a single channel implant, there is a limit to which this internal electric field may be increased before short channel effect and drain induced barrier lowering occurs.

Hence, a need exists for an improved MOS device for higher power gain and improved radio frequency response while reducing short channel effect and drain induced barrier lowering.

DETAILED DESCRIPTION OF THE PREFERRED EMBODIMENT

Generally, the present invention relates to an NMOS transistor design with improved DC gain and transconductance. First and second implant regions with different doping concentrations are disposed adjacent to the source region and gate region for tailoring the profile of the lateral channel region. The first and second implant regions also act as source protection from punch through electric fields. By using the implants, the channel doping profile is tailored to obtain the optimum internal electric field to maximize device transconductance, while simultaneously controlling the device threshold voltage and punch through characteristics.

Figure 1:
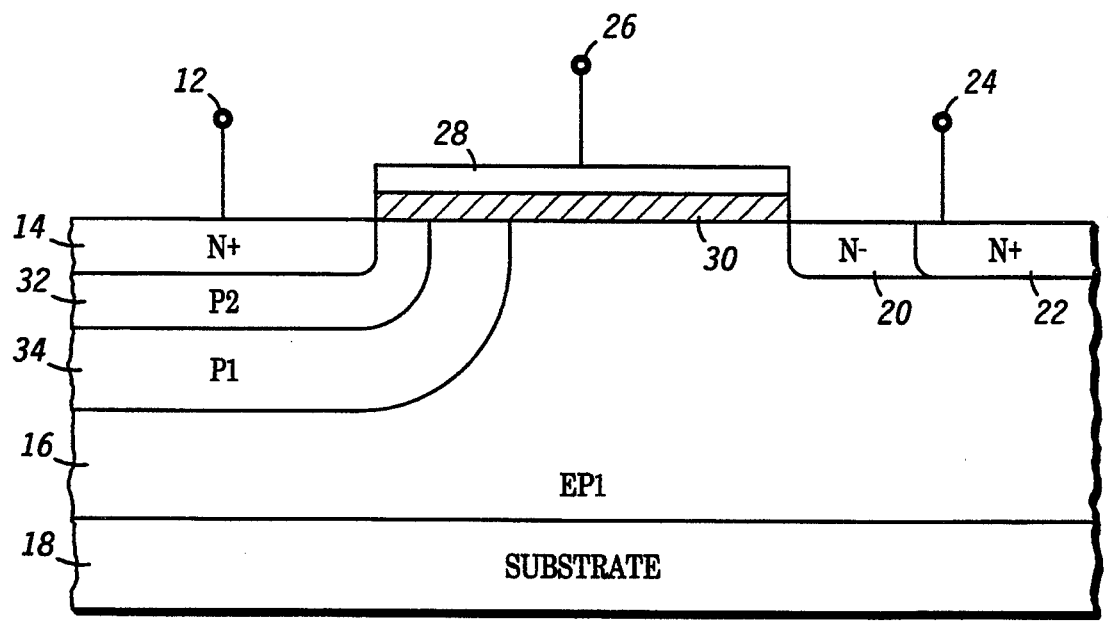
FIG. 1 illustrates a MOS transistor layout.

FIG. 1 illustrates an NMOS field effect transistor 10 including double lateral channel implant regions 32 and 34 which provide increased DC gain and transconductance. Transistor 10 includes an epitaxial layer 16 grown on substrate 18. In many applications epitaxial layer 16 is not needed and the device can be formed in substrate 18. Substrate 18 and epitaxial layer 16 are both p type semiconductor material.

A drain region is formed by a lightly doped drain extension region 20 in combination with a heavily doped drain region 22. The drain region is formed by lightly doping drain region 20 as n− type semiconductor material and heavily doped drain region 22 as n+ type semiconductor material. There are some applications where there would be no need for the n− region 20 whereby n+ region 22 would act as the drain of transistor 10. The drain region is contacted by a conductive contact at drain terminal 24.

A gate electrode 28 that overlays channel regions 32, 34 and 16 is separated from channel regions 32, 34 and 16 by an insulator gate oxide 30. Gate electrode 28 can have a variety of configurations including a layer of polysilicon, or a layer of polysilicon that is covered by a metallic silicide, or a layer of metal, depending on the application. Gate electrode 28 is contacted by a conductive contact to gate terminal 26.

A source region is formed by a heavily doped region 14. The heavily doped source region 14 is doped as n+ type semiconductor material. There are applications where there would be an n− region in conjunction with source region 14, similar to that seen on drain region 20-22. Source region 14 is contacted by a conductive contact at source terminal 12.

A channel region is formed by first and second implant regions 32 and 34. The first implant region 32 is implanted and self-aligned below source region 14 and extending up a channel side of source region 14 to gate region 28-30. The second implant region 34 is implanted and self-aligned between first implant region 32 an substrate region 18 and extending up a channel side of source region 14 to gate region 28-30. Implant regions 32 and 34 receive any additional activation or diffusion cycles present in the process. The lateral channel implant regions 32 and 34 are formed with p type semiconductor material.

Figure 2:
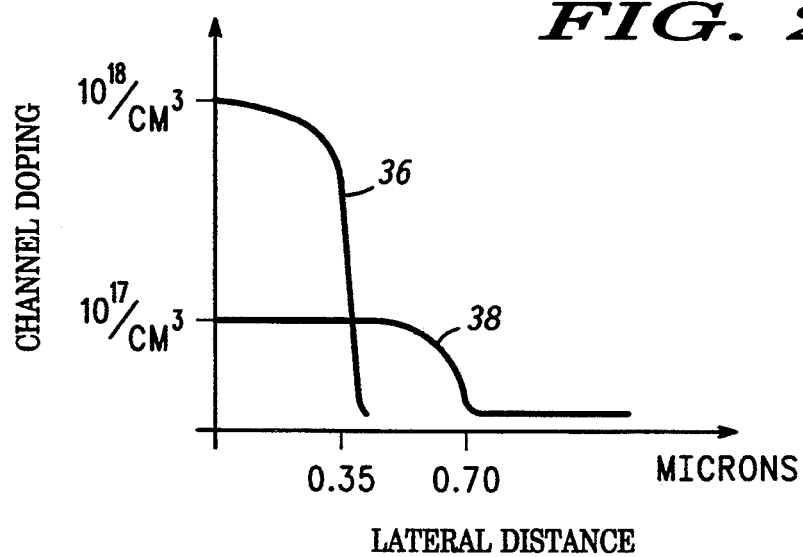
FIG. 2 is a plot useful in the explanation of the invention.

FIG. 2 shows the lateral doping profile of implant regions 32 and 34 from FIG. 1. The lateral profile for region 32 is represented by curve 36 in FIG. 2, while the lateral profile for implant region 34 is represented by curve 38. Curve 36 ranges from a maximum of $10^{18}$ atoms of dopant/cm$^3$ at minimum lateral distance from the source side of the gate to minimum channel doping at approximately 0.35 microns lateral distance. Curve 38 ranges from a maximum of $10^{17}$ atoms of dopant/cm$^3$ at minimum lateral distance from the source side of the gate to minimum channel doping at approximately 0.7 microns lateral distance. The sharp profile seen in curve 36 represents a large concentration gradient near source region 14 in the lateral direction in the channel. The internal electric field of the device in the channel region is directly proportional to the concentration gradient. A large concentration gradient results in a large internal electric field to assist carrier transport. The device transconductance is proportional to the internal electric field, so the increase in electric field results in an increase in the transconductance.

Although the sharp lateral profile improves transconductance, it suffers from poorer threshold control and punch through immunity compared to lower concentration gradients. To solve this concern, the second implant region 34 is performed earlier in the process and its lateral concentration profile is represented in curve 38 of FIG. 2. The curve 38 profile also shows a concentration gradient that assists in increasing the transconductance, but it is lower than that seen in curve 36. The deeper implant region assists in greater transconductance and the increased charge reduces punch through effects and stabilizes threshold voltages.

Thus, channel implant region 32 is formed with a higher dose and shorter drive time to obtain a steep profile to greatly improve the transconductance, while channel implant region 34 is formed previously with a lower dose and longer drive time to obtain a softer profile across more of the channel region to somewhat improve transconductance and greatly improve punch through and threshold characteristics.

It has been found that the transconductance of the double lateral channel implanted transistor increased by over 28% as compared to a single lateral channel implanted device of similar structure.

By now it should be appreciated that we have provided a novel way to improve the performance, specifically transconductance, of field effect transistor 10. An improved tailoring of the channel lateral doping through the use of a dual implant increases the transconductance of the device while allowing simultaneous optimization of other parameters such as threshold and punch through characteristics. Other techniques to improve transconductance generally require advancements in processing technologies, e.g. advances in photolithographic techniques, or advances in thin insulator growth techniques, while the technique disclosed herein uses existing equipment technologies.

There are many applications for higher transconductance devices. The increased transconductance provides increased power gain for RF transistor applications which lowers system costs. Frequency response of MOS devices is proportional to transconductance, so an improvement in the transconductance provides improved high frequency performance for high speed applications. Also the increased RF and DC gain improves low voltage operation of the devices thereby improving battery life, performance, and cost in portable systems.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An MOS transistor, comprising:
    a source region having a first type of semiconductor material;
    a substrate region having a second type of semiconductor material;
    a first implant region disposed below said source region and extending up a channel side of said source region, said first implant region having said second type of semiconductor material with a first doping concentration; and
    a second implant region disposed between said first implant region and said substrate region and extending up a channel side of said source region, said second implant region having said second type of semiconductor material with a second doping concentration.

2. The MOS transistor of claim 1 further including a drain region having said first type of semiconductor material disposed above said substrate region.

3. The MOS transistor of claim 2 further including a gate region disposed above said substrate region and between said source region and said drain region.

4. The MOS transistor of claim 3 wherein said first type of semiconductor material is n type semiconductor material.

5. The MOS transistor of claim 4 wherein said second type of semiconductor material is p type semiconductor material.

6. A method of forming a MOS transistor, comprising the steps of:
    providing a source region having a first type of semiconductor material;
    providing a substrate region having a second type of semiconductor material;
    disposing a first implant region below said source region and extending up a channel side of said source region, said first implant region having said second type of semiconductor material with a first doping concentration; and
    disposing a second implant region between said first implant region and said substrate region and extending up a channel side of source region, said second implant region having said second type of semiconductor material with a second doping concentration.

7. The method of claim 6 further including the step of disposing a drain region having said first type of semiconductor material above said substrate region.

8. The method of claim 7 further including the step of disposing a gate region above said substrate region and between said source region and said drain region.

9. The method of claim 8 wherein said first type of semiconductor material is n type semiconductor material.

10. The method of claim 9 wherein said second type of semiconductor material is p type semiconductor material.

11. An NMOS transistor, comprising:
    a source region having a n+ type of semiconductor material;
    a drain region having said n+ type of semiconductor material;
    a substrate region disposed between said source region and said drain region having a p type of semiconductor material;
    a gate region disposed above said substrate region and between said source region and said drain region;
    a first implant region disposed below said source region and extending up a channel side of said source region to said gate region, said first implant region having said p type of semiconductor material with a first doping concentration; and
    a second implant region disposed between said first implant region and said substrate region and extending up to a channel side of source region to said gate region, said second implant region having said p type of semiconductor material with a second doping concentration.

* * * * *